US008304910B2

(12) United States Patent
Koyama

(10) Patent No.: US 8,304,910 B2
(45) Date of Patent: Nov. 6, 2012

(54) SEMICONDUCTOR DEVICE AND METHOD OF PRODUCING THE SAME

(75) Inventor: Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/546,383

(22) Filed: Aug. 24, 2009

(65) Prior Publication Data

US 2010/0052182 A1 Mar. 4, 2010

(30) Foreign Application Priority Data

Aug. 29, 2008 (JP) ................................. 2008-222197

(51) Int. Cl.
*H01L 23/48* (2006.01)

(52) U.S. Cl. ................... 257/773; 257/734; 257/E21.01

(58) Field of Classification Search .................. 257/773, 257/734, E23.01; 438/618, 637, E21.575
See application file for complete search history.

(56) References Cited

U.S. PATENT DOCUMENTS 5,300,814 A * 4/1994 Matsumoto et al. .......... 257/758
6,392,252 B2 5/2002 Hiromi
2006/0118885 A1* 6/2006 Song ............................ 257/379

FOREIGN PATENT DOCUMENTS

JP 11-340320 12/1999
JP 2001-135570 5/2001

* cited by examiner

*Primary Examiner* — Alexander Ghyka
*Assistant Examiner* — Stanetta Isaac
(74) *Attorney, Agent, or Firm* — Oblon, Spivak, McClelland, Maier & Neustadt, L.L.P.

(57) ABSTRACT

A lack of exposure margin is avoided in a region, where an interconnection is required in a direction different from that of an interconnection of a region where an exposure condition is optimized. A semiconductor device According to an aspect of the invention includes a semiconductor substrate 201; an interlayer insulating film 202 that is formed on the semiconductor substrate 201; a plurality of first interconnections 1, 1, . . . that are formed in a first region on the interlayer insulating film 202 while complying with a first design rule, the first interconnections running along a specific direction; a plurality of second interconnections 2, 2, . . . that are formed in a second region on the interlayer insulating film 202 while complying with a second design rule identical to the first design rule, the second interconnections running along the same direction with that of the first interconnections 1, 1, . . . ; and a connection member 3 that is formed in the interlayer insulating film 202, the connection member forming a desired interconnection pattern by electrically connecting at least the two second interconnections 2 and 2 that should become an identical potential.

17 Claims, 16 Drawing Sheets

SEMICONDUCTOR DEVICE AND METHOD OF PRODUCING THE SAME

CROSS-REFERENCE TO RELATED APPLICATION

This application is based upon and claims the benefit of priority from prior Japanese Patent Application No. 2008-222197, filed on Aug. 29, 2008, the entire contents of which are incorporated herein by reference.

BACKGROUND OF THE INVENTION

1. Field of the Invention

The present invention relates to a semiconductor device, for example, a semiconductor storage device and a method of producing the semiconductor device.

2. Background Art

Recently, there is an increasing demand to form a finer pattern in order to deal with a finer design rule and higher integration of the semiconductor device. Particularly, in applicable design rules at the time of development, a relatively small design rule is applied to the semiconductor storage device for the purpose of large capacity. The semiconductor storage device has two regions in the same plane, that is, a memory cell region and a peripheral region except for the memory cell region in the same plane. Generally, the memory cell region differs from the peripheral region in the applied design rule. The memory cell region includes a bit line or a word line, which is connected to a memory cell (storage element). In the memory cell region, usually the design rule is set to a minimum value (hereinafter simply referred to as F) that is permitted at the time of development in order to enhance an integration degree. On the other hand, the peripheral region includes an interconnection which connects the memory cell and a driving element of the memory cell. In the peripheral region, it is not always necessary that the design rule be set to the minimum value F, but the design rule is frequently set to a value larger than the minimum value F.

In order to optimize an exposure condition, there is well known a method of performing exposure with deformed illumination, that is, exposure with exposure light deformed by an aperture interposed between an exposure light source and a reticle (for example, see Japanese Patent Application Laid-Open No. 2001-135570). The method can improve resolution and a Depth Of Focus (DOF). However, in cases where the aperture having a shape of FIG. 4 disclosed in Japanese Patent Application Laid-Open No. 2001-135570 is used, sometimes the resolution and DOF are degraded to a crosswise pattern compared with the usual exposure while the resolution and DOF are improved to a longitudinal pattern.

SUMMARY OF THE INVENTION

According to a first aspect of the invention, there is provided a semiconductor device including: a semiconductor substrate; an interlayer insulating film that is formed on the semiconductor substrate; a plurality of first interconnections that are formed in a first region on the interlayer insulating film while complying with a first design rule, the plurality of first interconnections running along a specific direction; a plurality of second interconnections that are formed in a second region on the interlayer insulating film while complying with a second design rule identical to the first design rule, the plurality of second interconnections running along the specific direction; and a connection member that is formed in the interlayer insulating film, the connection member forming a desired interconnection pattern by electrically connecting at least the two second interconnections that should become an identical potential.

According to a second aspect of the invention, there is provided a semiconductor device including: a semiconductor substrate; a first interlayer insulating film that is formed on the semiconductor substrate; a plurality of first interconnections that are formed in a first region on the first interlayer insulating film while complying with a first design rule, the plurality of first interconnections running along a specific direction; a plurality of second interconnections that are formed in a second region on the first interlayer insulating film while complying with a second design rule identical to the first design rule, the plurality of second interconnections running along the specific direction; a second interlayer insulating film that is formed on the first interlayer insulating film; and a connection member that is formed in the second interlayer insulating film, the connection member forming a desired interconnection pattern by electrically connecting at least the two second interconnections that should become an identical potential.

According to a third aspect of the invention, there is provided a method of producing a semiconductor device including a plurality of first interconnections in a first region and a plurality of second interconnections in a second region, the plurality of first interconnections and the plurality of second interconnections being formed on an interlayer insulating film while complying with a design rule smaller than minimum resolution of a lithography apparatus, the plurality of first interconnections and the plurality of second interconnections running along a specific direction, the interconnections that should become an identical potential in the plurality of second interconnections being electrically connected by a connection member to form a desired interconnection pattern, the semiconductor device producing method includes forming the interlayer insulating film on a semiconductor substrate; embedding a conductive material in a contact hole to form the connection member after the contact hole is made in a predetermined position of the interlayer insulating film in the second region; forming a conductive film on the interlayer insulating film and connection member; forming a mask material above the conductive film; fabricating the mask material into a pattern by lithography, the pattern having a width double the design rule and a space double the design rule; etching the mask material by wet etching until the width of the pattern becomes a half; forming a circular mask material having a thickness identical to that of the design rule on a sidewall surface of the mask material such that the mask material is surrounded; forming a circular conductive film by etching the conductive film with the circular mask material as a mask after the mask material is removed; and forming the plurality of first interconnections and the plurality of second interconnections by etching and removing an end portion of the circular conductive film.

DESCRIPTION OF THE EMBODIMENTS

A background to the present invention made by the inventor will be described before an embodiment of the invention is described. As described above, when the exposure is performed with the deformed illumination, although the resolution and DOF are improved in a specific direction, sometimes the resolution and DOF are degraded in other directions compared with the usual exposure.

However, for example, in the memory cell region of the semiconductor storage device, the unidirectional interconnection is frequently used like the bit line or word line. Further, exposure conditions such as an illumination condition of the deformed illumination are determined by paying attention to the memory cell region to which the minimum design rule is applied. Therefore, an especially large disadvantage caused by the problem is not generated when the deformed illumination is performed according to the direction of the interconnection in the memory cell region.

On the other hand, as described above, the design rule larger than that of the memory cell region is applied to the peripheral region. However, in the peripheral region, frequently a design rule that is relatively 1.5 to triple the minimum value F is applied to an area adjacent to the memory cell region. In the area adjacent to the memory cell region, sometimes DOF that is of an exposure margin of lithography becomes a half or less compared with the memory cell region. In the peripheral region, the interconnection in the direction different from the interconnection of the memory cell region, that is, the interconnection bending is inevitable due to routing of the interconnection. Therefore, when the exposure condition is optimized to the memory cell region using the deformed illumination, there is a risk of reducing exposure margin in the interconnection bending portion.

As described above, the problem is being come out that the exposure becomes difficult rather in the peripheral region than in the memory cell region to which the minimum design rule is applied. The problem will be described in detail with reference to an interconnection layout diagram in the memory cell region and peripheral region.

Figure 1:
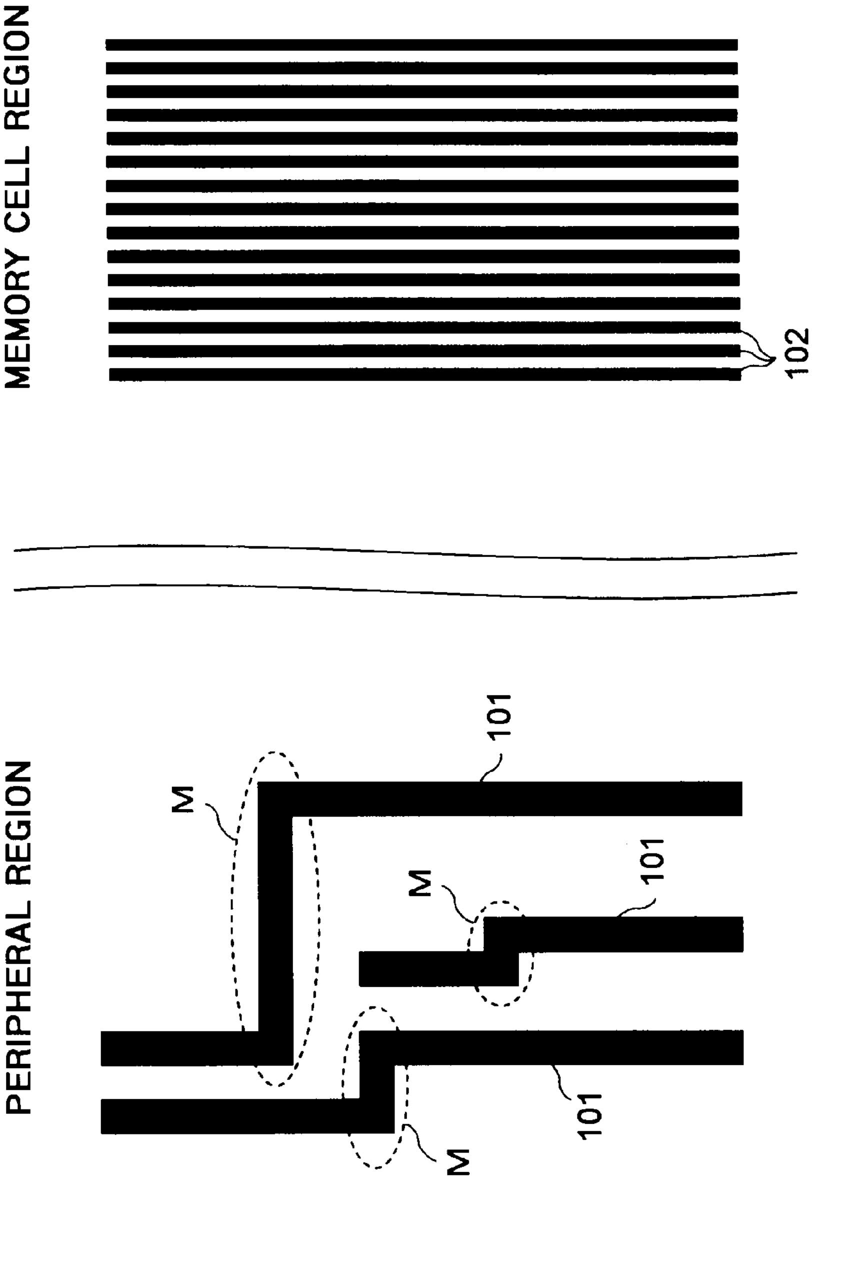
FIG. 1 illustrates an example of an interconnection layout in a conventional semiconductor storage device.

FIG. 1 illustrates an example of an interconnection layout in a conventional semiconductor storage device. As illustrated in FIG. 1, the peripheral region and the memory cell region exist in the same plane. In FIG. 1, interconnections 101, 101, . . . in the peripheral region run not only in the longitudinal direction but also in the crosswise direction. That is, the interconnection 101 has the bending portion (portion M in FIG. 1) in the peripheral region. At this point, the interconnection 101 has a width of 3 F.

On the other hand, interconnections 102, 102, . . . in the memory cell region are formed while complying with a design rule smaller than that of the interconnections 101 in the peripheral region. That is, the width of the interconnection 102 and the space between the interconnections are formed while complying with the minimum value F. As is clear from FIG. 1, the interconnections 102 are formed only in the longitudinal direction. Although the interconnection 102 in the memory cell region is formed while complying with the minimum design rule, frequently the interconnection 102 is linearly formed because the bending portion is not necessary.

As described above, the interconnections 101 and 102 are formed in the same layer in the same plane. Accordingly, usually the interconnections 101 and 102 are formed through one-time lithographic process using one reticle including the interconnection layout of FIG. 1 having different sizes and shapes. However, in the lithography process, when the exposure condition is optimized to the memory cell region, the reducing exposure margin is possibly generated in the peripheral region as described above. In order to avoid the generation of the lack of exposure margin, for example, a reticle for the memory cell region and a reticle for the peripheral region are separately prepared, and the exposure is performed twice on the exposure conditions optimized to the regions. However, there is generated a new problem in that a decrease of throughput and an increase of cost are generated due to the increase of the number of processes.

The inventor made the present invention based on the unique technical acknowledgement.

In the invention, in order to solve the problem, the interconnection in the peripheral region is formed in the same direction as the interconnection in the memory cell region. A connection member that is formed in a layer different from that of the interconnection is formed in the interconnection bending portion so as to cross the space between the interconnections, and the interconnections that should become an identical potential are electrically connected to obtain a desired interconnection pattern. Therefore, the direction in which the interconnection runs in the peripheral region can be matched with the direction in which the interconnection runs in the memory cell region. Further, in forming an interconnection resist pattern, even if the exposure condition is optimized to the memory cell region to simultaneously perform the exposure to the memory cell region and the peripheral region, the reducing exposure margin is prevented in the peripheral region.

Three embodiments of the invention will be described with reference to the drawings. In the following description, the same component having the similar function is designated by the same numeral, and the detailed description is omitted.

A first embodiment and a second embodiment relate to a semiconductor device. The first embodiment is identical to the second embodiment in that portions where the interconnection bending is required are electrically connected by a connection member. The first embodiment differs from the second embodiment in the number of interconnections connected by the connection member. That is, the connection member connects two interconnections adjacent to each other in the first embodiment, and the connection member connects at least three interconnections in the first embodiment.

A third embodiment relates to a method of producing the semiconductor devices of the first and second embodiments. In the semiconductor device producing method of the third embodiment, the lack of exposure margin is avoidable in the peripheral region through a process for being able to form a pattern smaller than the minimum resolution of the lithography apparatus used, that is, a so-called sidewall fabricating process.

First Embodiment

Figure 2A:
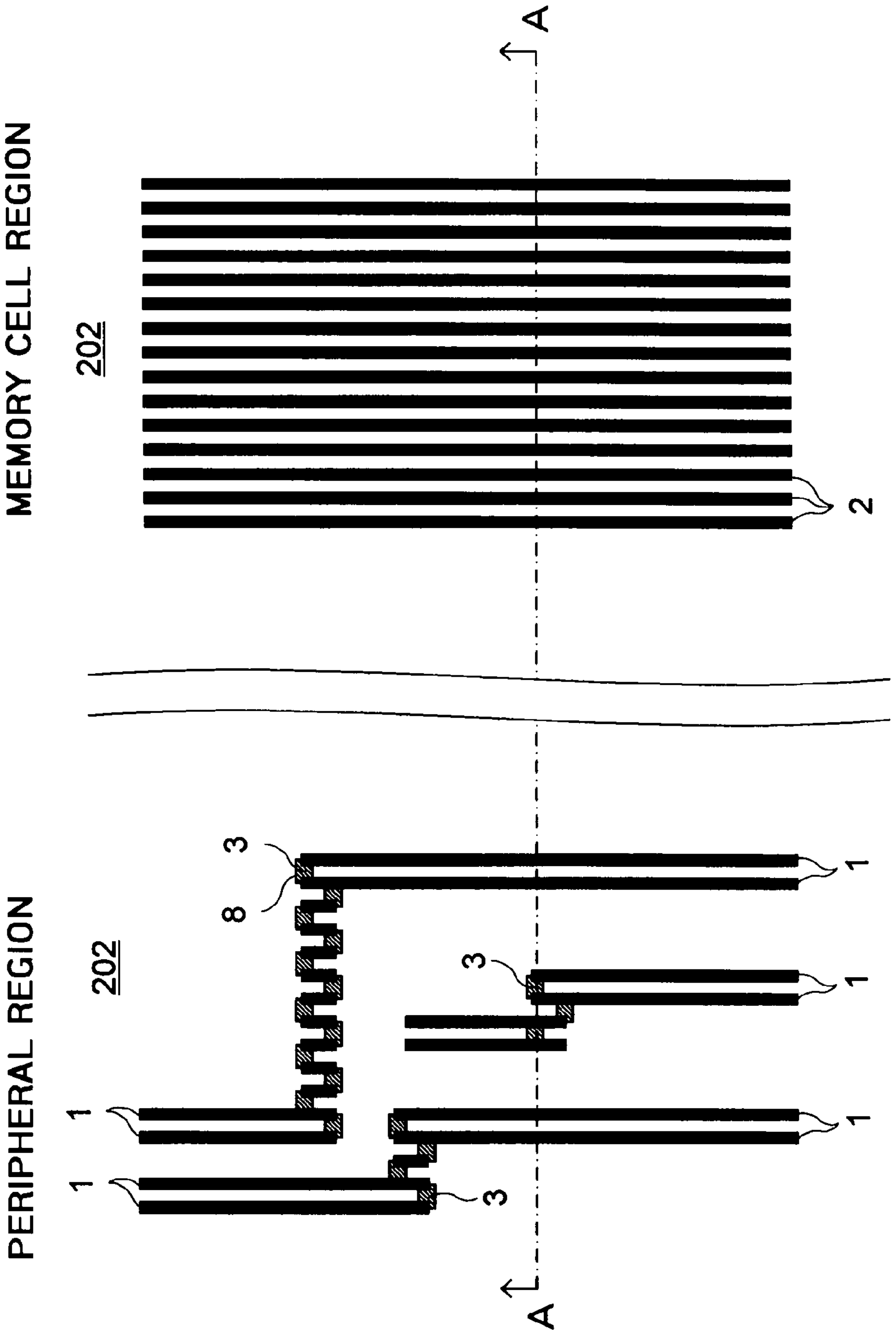
FIG. 2A is a plan view illustrating an interconnection layout in a semiconductor device according to a first embodiment of the invention.
Figure 2B:
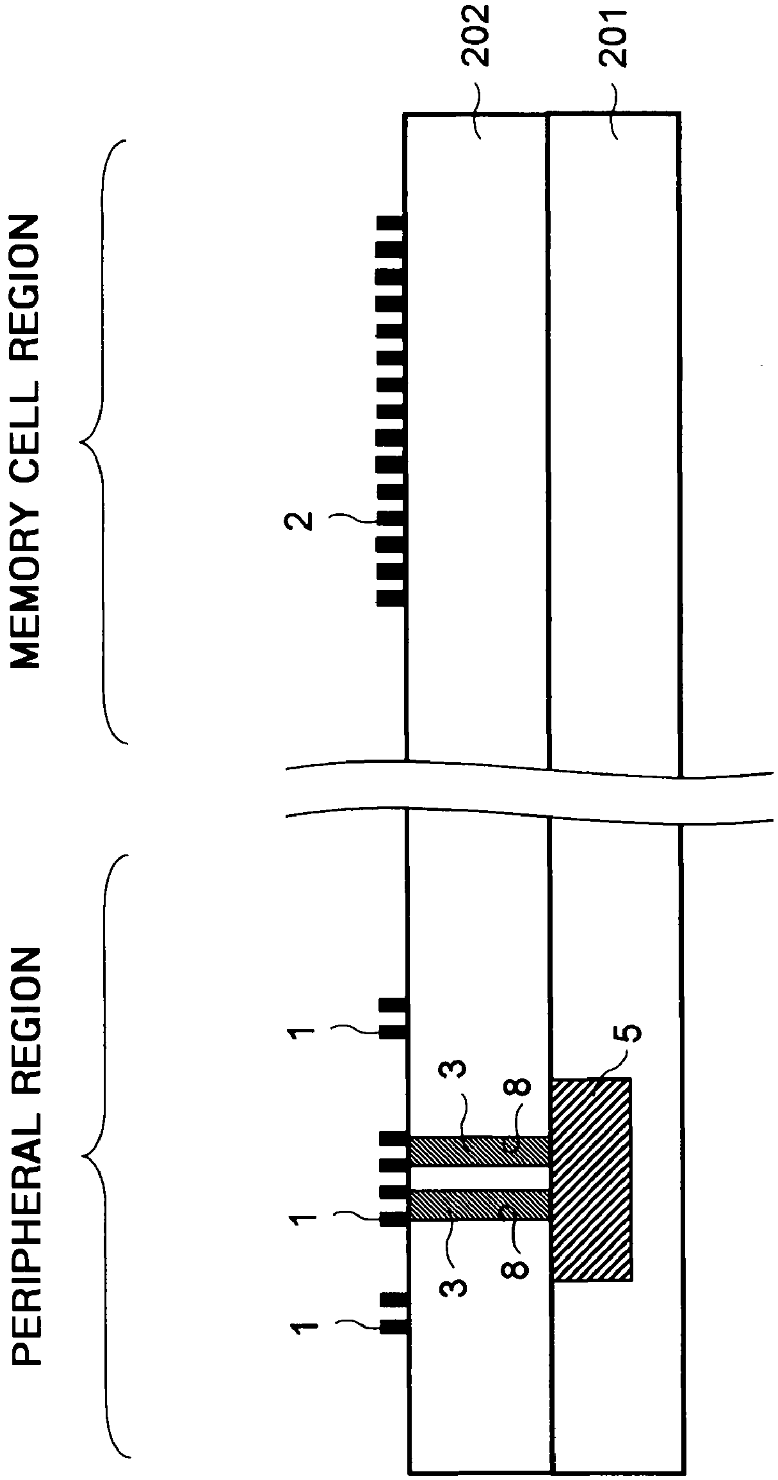
FIG. 2B is a sectional view taken along a line A-A of FIG. 2A.

A semiconductor device according to a first embodiment of the invention will be described. FIG. 2A is a plan view illustrating an interconnection layout in a semiconductor device of the first embodiment. The interconnection layout of FIG. 2A is drawn so as to be compared with the conventional layout of FIG. 1. FIG. 2B is a sectional view taken along a line A-A of FIG. 2A.

As illustrated in FIG. 2A, interconnections 1, 1, . . . of a peripheral region and interconnections 2, 2, . . . of a memory cell region are formed in a longitudinal direction on an interlayer insulating film 202. A width of the interconnection 1 is a minimum value F. A width of the interconnection 2 and a space between the interconnections 2 and 2 are the minimum value F. The interconnections 1 and 2 are made of a conductive material, for example, metal such as tungsten, aluminum, and copper. Additionally, polysilicon in which an impurity such as phosphorus and arsenic is doped may be used as the interconnections 1 and 2.

As illustrated in FIG. 2B, the interlayer insulating film 202 is formed on a semiconductor substrate 201. The interconnections 1, 1, . . . and the interconnections 2, 2, . . . are formed on the interlayer insulating film 202. A contact hole 8 is made in the interlayer insulating film 202 so as to cross a space between the adjacent interconnections 1 and 1. A connection member 3 is a conductive material with which the contact hole 8 is filled, and the connection member 3 electrically connects the adjacent interconnections 1 and 1 that should become an identical potential. That is, the connection member 3 acts substantially as the conventional interconnection bending. Although not illustrated in FIG. 2B, a transistor constituting a memory cell is prepared on the semiconductor substrate 201 in a memory cell region, and a terminal of the transistor and the interconnection 2 are connected by a contact plug formed in the interlayer insulating film 202.

Because the connection member 3 is formed in a layer different from that of the interconnection 1, there is a risk of establishing an electric conduction between the connection member 3 and a conductive material (such as the interconnection and transistor terminal on the semiconductor substrate 201) existing in the layer different from that of the interconnection 1. In order to prevent such unexpected electric connections, as is clear from FIG. 2B, an insulating region 5 in the semiconductor substrate 201 is provided so as to abut on the connection member 3. A trench is formed in the semiconductor substrate 201, and the trench is filled with an insulating film, thereby forming the insulating region 5. The insulating region 5 may be an isolation region that electrically separates elements formed on the semiconductor substrate 201, such as STI (Shallow Trench Isolation). The insulating region 5 may be omitted in cases where an insulating layer abutting on the connection member 3 is provided above the semiconductor substrate 201 or in cases where a bottom portion of the connection member 3 exists in the interlayer insulating film 202.

Figure 3A:
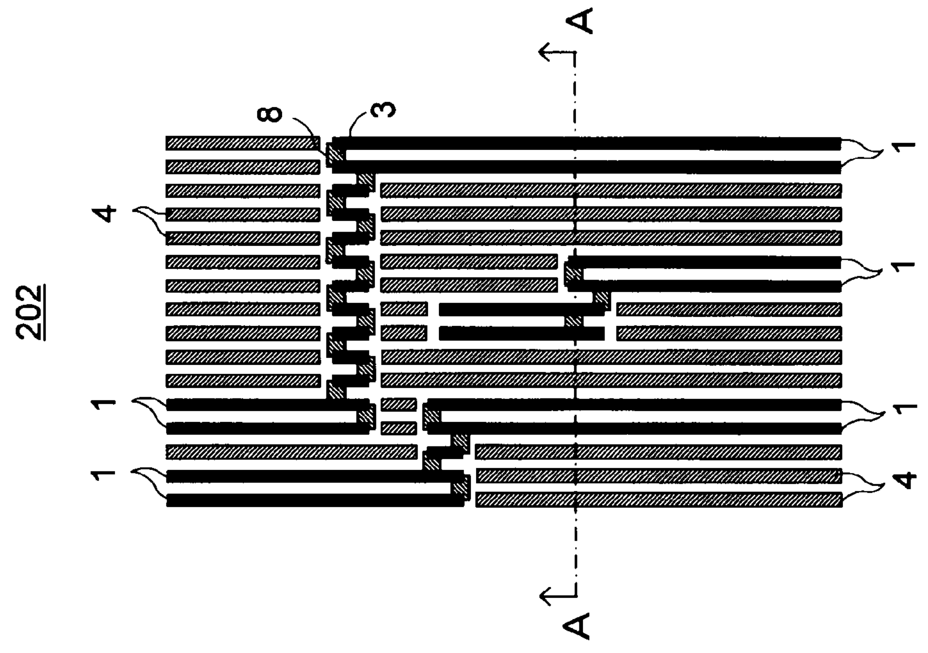
FIG. 3A is a plan view illustrating a modification of an interconnection layout of a peripheral region in a semiconductor device according to the first embodiment.
Figure 3B:
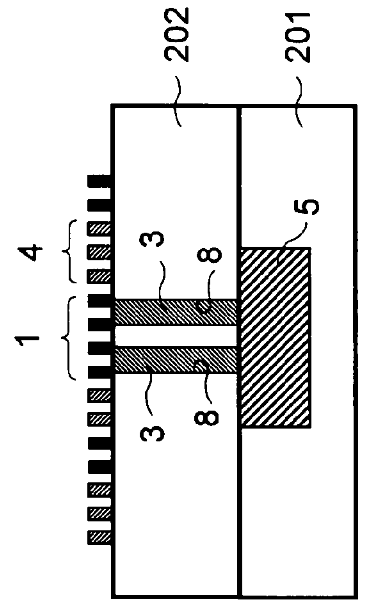
FIG. 3B is a sectional view taken along a line A-A of FIG. 3A.

A modification in which a dummy interconnection is added to the interconnection in the peripheral region will be described with reference to FIG. 3A. As illustrated in FIG. 3A, in the modification, dummy interconnections 4, 4, . . . provided in the same direction as the interconnection 1 are added to the interconnection layout in the peripheral region of FIG. 2A. A width of the dummy interconnection 4 is identical to the width of the interconnection 1, and a space between the dummy interconnections 4 and 4 is identical to the space between the interconnections 1 and 1. The dummy interconnections are disposed in a wide space between the interconnections 1 and 1 to enhance periodicity of a resist pattern, so that the exposure margin can be improved in a lithographic process. FIG. 3B is a sectional view taken along a line A-A of FIG. 3A.

Three modifications regarding placement of the connection member 3 will be described below. In the first embodiment, the connection member 3 is disposed below the interconnection 1. On the other hand, in the modifications, the connection member 3 is disposed on the interconnection 1.

Figure 4:
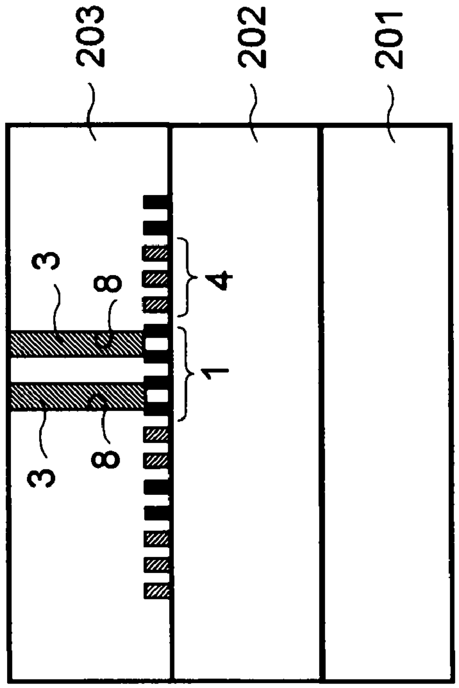
FIG. 4 is a sectional view illustrating a modification regarding placement of a connection member.

FIG. 4 illustrates a first modification regarding the placement of the connection member. As illustrated in FIG. 4, the interlayer insulating film 202 and an interlayer insulating film 203 are formed in order on the semiconductor substrate 201. The interconnections 1, 1, . . . and the dummy interconnections 4, 4, . . . are formed on the interlayer insulating film 202. The contact hole 8 is made in the interlayer insulating film 203 as so to across the space between the adjacent interconnections 1 and 1. The connection member 3 is formed by filling the contact hole 8 with the conductive material. The connection member 3 electrically connects the two adjacent interconnections 1 and 1 that should become an identical potential. In cases where an upper-layer interconnection (not illustrated) is disposed on the interlayer insulating film 203, an insulation property is ensured between the connection member 3 and the upper-layer interconnection such that a potential at the interconnection 1 is not influenced by the upper-layer interconnection.

Figure 5A:
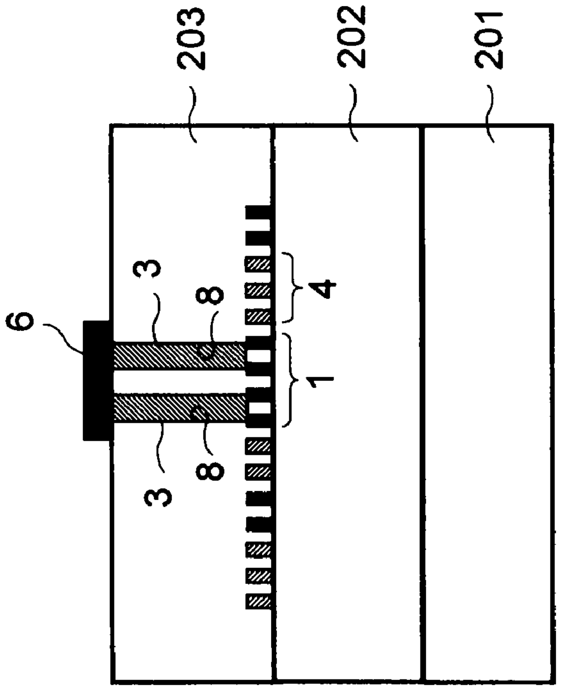
FIG. 5A is a sectional view illustrating another modification regarding the placement of the connection member.

FIG. 5A illustrates a second modification regarding the placement of the connection member. In the second modification, the interconnection 1 is electrically connected to an upper-layer interconnection 6 that is disposed in a different layer. As illustrated in FIG. 5A, the upper-layer interconnection 6 is formed on the interlayer insulating film 203, and the connection member 3 electrically connects the adjacent interconnections 1 and 1 while electrically connecting the interconnection 1 and the upper-layer interconnection 6. That is, the upper-layer interconnection 6 is used as an auxiliary interconnection that connects the adjacent connection members 3 and 3. The upper-layer interconnection 6 is disposed so as not to be influenced by an unexpected potential at another interconnection.

Figure 5B:
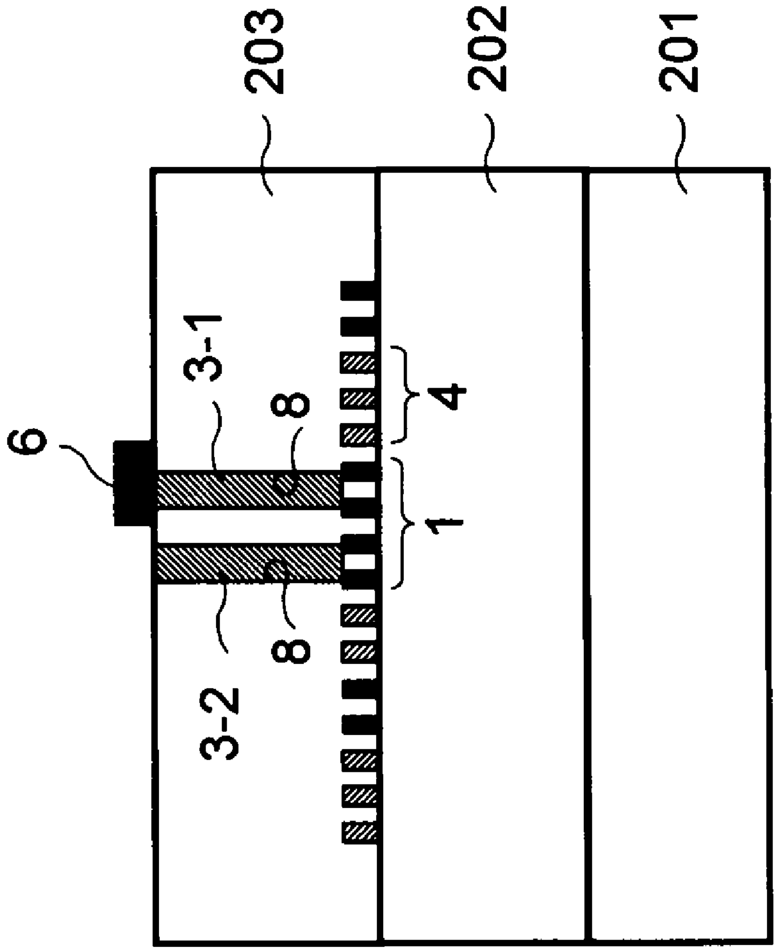
FIG. 5B is a sectional view illustrating still another modification regarding the placement of the connection member.

FIG. 5B illustrates a third modification regarding the placement of the connection member. In the third modification, the upper-layer interconnection 6 disposed in a layer different from that of the interconnection 1 is electrically connects one of a plurality of connection members. As illustrated in FIG. 5B, the upper-layer interconnection 6 is formed on the interlayer insulating film 203. Each of connection members 3-1 and 3-2 electrically connects the adjacent interconnections 1 and 1. The connection member 3-1 electrically connects the interconnection 1 and the upper-layer interconnection 6. The connection member 3-2 is not connected to the upper-layer interconnection 6. That is, in the third modification, the upper-layer interconnection 6 is used as not the auxiliary interconnection of the connection member 3 unlike the second modification, but a so-called routing interconnection that connects the interconnection 1 and 1 that are not adjacent to each other. In such cases, the connection member 3-1 is used as a contact member that connects the interconnection 1 and the upper-layer interconnection 6.

The dummy interconnection 4 may be omitted in the second and third modifications. The width and space of the interconnection in the peripheral region may be larger than the minimum value F.

Figure 15:
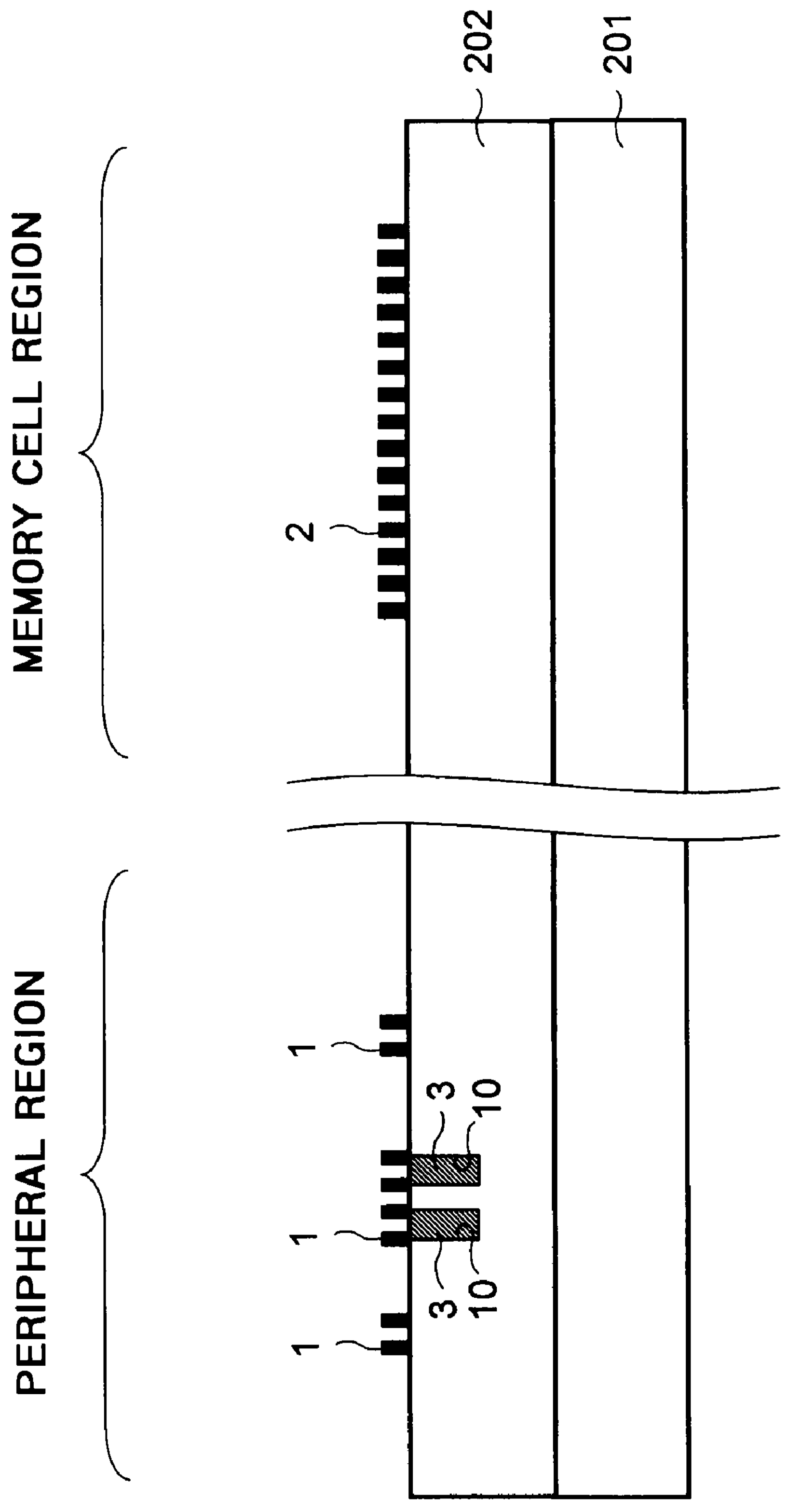
FIG. 15 is a sectional view illustrating still another modification regarding the placement of the connection member.

In the first embodiment, the connection member 3 is the conductive material embedded in the contact hole 8 piercing the interlayer insulating film 202. Alternatively, as illustrated in FIG. 15, the connection member 3 may be a conductive material embedded in a trench 10 formed in the interlayer insulating film 202. The trench 10 is formed halfway in the interlayer insulating film 202, and the trench 10 does not pierce the interlayer insulating film 202.

As described above, in the first embodiment, the interconnection in the peripheral region is linearly formed in the same direction as the interconnection in the memory cell region, and the connection member acting as the interconnection bending is disposed in the position in which the interconnection bending is required, so that the interconnection bending shape having a risk of reducing the exposure margin is avoidable in the peripheral region while a desired interconnection pattern is obtained. In forming the interconnection resist pattern, the reducing exposure margin is avoidable in the peripheral region even if the exposure is performed on the exposure condition optimized for the memory cell region. That is, the reducing exposure margin is avoidable in the region in which the interconnection is required in the direction different from that of the region where the exposure condition is optimized.

Second Embodiment

A semiconductor device according to a second embodiment of the invention will be described below. As described above, the semiconductor device of the second embodiment differs from the semiconductor device of the first embodiment in that the connection member crosses spaces among a plurality of interconnections to electrically connect at least three interconnections.

Figure 6B:
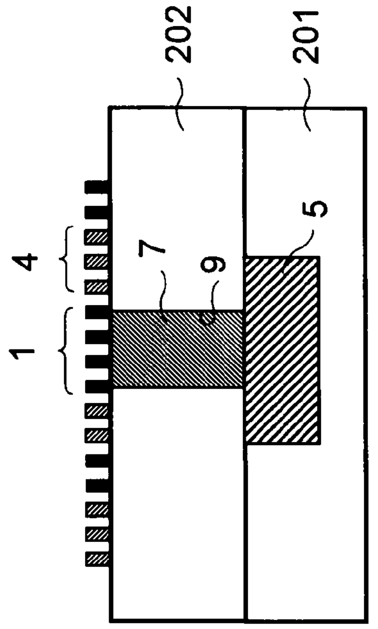
FIG. 6B is a sectional view taken along a line A-A of FIG. 6A.
Figure 6A:
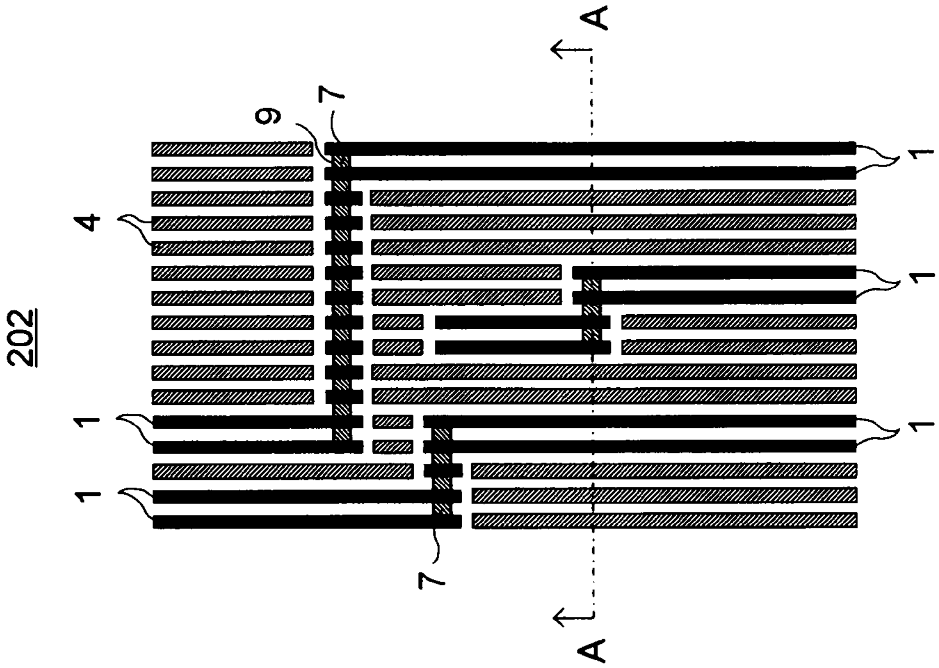
FIG. 6A is a plan view illustrating an interconnection layout of a peripheral region in a semiconductor device according to a second embodiment of the invention.

FIG. 6A illustrates an interconnection layout of a peripheral region in a semiconductor device of the second embodiment. The interconnection layout of FIG. 6A is drawn so as to be compared with the conventional layout of FIG. 1. FIG. 6B is a sectional view taken along a line A-A of FIG. 6A.

As illustrated in FIG. 6A, as with the first embodiment, the interconnections 1, 1, . . . and the dummy interconnection 4, 4, . . . are formed in the longitudinal direction on the interlayer insulating film 202. Both the width of the interconnection 1 (4) and the space between the interconnections 1 and 1 (4 and 4) are the minimum value F. As illustrated in FIG. 6B, a contact hole 9 is made so as to cross the spaces among a plurality of interconnections 1 and 1. A connection member 7 is a conductive material embedded in the contact hole 9, and the connection member 7 electrically connects the four interconnections 1, 1, 1, and 1 that should become an identical potential. As illustrated in FIG. 6A, the connection member 7 is provided so as to be linearly extended in a direction intersecting the direction of the interconnection 1. That is, the connection member 7 acts substantially as the conventional interconnection bending.

In the semiconductor device of the second embodiment, the interconnection layout in the memory cell region is similar to that of the first embodiment (FIG. 2A).

In the second embodiment, the connection member 7 is embedded in the contact hole 9 piercing the interlayer insulating film 202. Alternatively, the connection member 7 may be embedded in a trench formed halfway in the interlayer insulating film 202. The width and space of the interconnection in the peripheral region may be larger than the minimum value F. The dummy interconnections 4, 4, . . . may be omitted.

As described in the first embodiment of FIGS. 4, 5A, and 5B, the connection member 7 may be formed above the interconnection 1. At this point, similarly the connection member 7 is disposed so as not to be influenced by an unexpected potential at an unrelated interconnection.

As described above, in the second embodiment, the connection member 7 is formed so as to cross the spaces among the plurality of interconnections. Therefore, a risk of opening the connection between the interconnections can be reduced in addition to the action and effect of the first embodiment. Further, the contact hole 9 has a horizontally long shape, so that the connection member 7 can easily be dealt with the long space between the adjacent interconnection that should be connected to each other.

Third Embodiment

A semiconductor device producing method according to a third embodiment of the invention will be described below. As described above, in the semiconductor device producing method of the third embodiment, the semiconductor devices of the first and second embodiments are produced by so-called sidewall fabricating process in which a pattern smaller than the minimum resolution of the lithography apparatus used can be formed.

In cases where the interconnection pattern in the peripheral region is formed with a minimum design rule, the desired interconnection complying with the minimum design rule can be obtained without any difficulty by the following technique when the minimum resolution of the lithography apparatus used is equal to or smaller than the minimum value F. That is, the conductive film and the resist are formed in order on the interlayer insulating film 202 and connection member 3 (7), the resist pattern whose width (line) and space have the minimum value F is formed by exposure and development, and the conductive film is etched with the resist pattern as the mask. However, recently sometimes the design rule is smaller than the minimum resolution of the lithography apparatus used. In the third embodiment, even if the design rule is smaller than the minimum resolution of the lithography apparatus used, the semiconductor devices of the first and second embodiments can be produced while the reducing exposure margin is avoidable in the peripheral region.

The semiconductor device producing method of the third embodiment will be described below with reference to FIGS. 7A to 14. FIGS. 7B to 12B are end views taken along lines C-D of FIGS. 7A to 12A. FIGS. 7A to 12A, 13, and 14 are plan views of the peripheral regions. The process for forming the interconnection progresses simultaneously in both the memory cell region and the peripheral region, and the process for forming the interconnection in the memory cell region is similar to that in the peripheral region except that the connection member 7(3) described above is eliminated.

(1) The semiconductor substrate 201 is fabricated to form the trench in a predetermined position, and the insulating film is embedded in the trench, thereby forming the insulating region 5. Then the interlayer insulating film 202 is formed on the semiconductor substrate 201 and the insulating region 5. Then a predetermined position of the interlayer insulating film 202 is opened to make the contact hole 9. Then the conductive material is embedded in the contact hole 9 to form the connection member 7. As is clear from FIG. 7B, the insulating region 5 is formed so as to abut on the connection member 7.

Figure 7B:
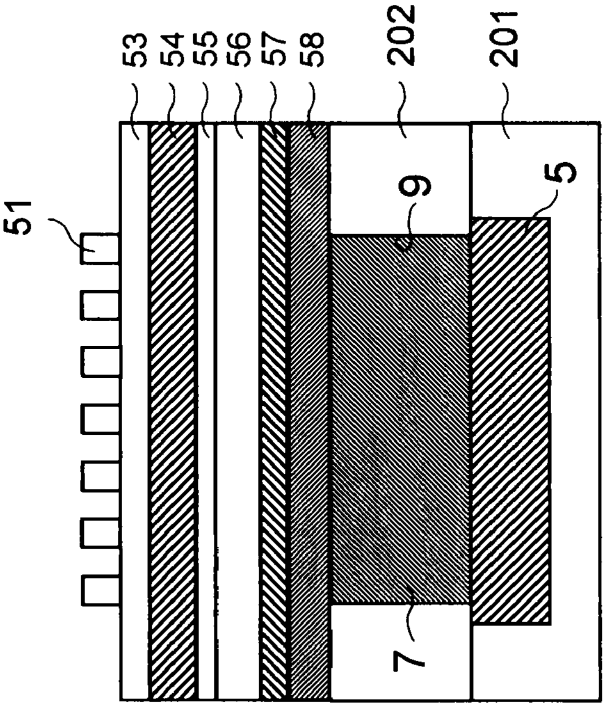
FIG. 7B is an end view taken along a line C-D of FIG. 7A.

(2) As illustrated in FIG. 7B, a conductive film 58, a first mask material 57, a second mask material 56, a third mask material 55, a fourth mask material 54, and a fifth mask material 53 are formed in order on the interlayer insulating film 202 and the connection member 7. As to a material used in each mask material, for example, a silicon nitride film is used as the first mask material 57, a silicon oxide film is used as the second mask material 56, the silicon nitride film is used as the third mask material 55, a TEOS film is used as the fourth mask material 54, and a polysilicon film is used as the fifth mask material.

A BSG film may be used as the second mask material 56 for the purpose of easy removal in the subsequent process. The conductive film 58 is made of a conductive material, for example, a metal such as tungsten, aluminum, and copper. Additionally, polysilicon in which an impurity such as phosphorus and arsenic is doped is used as the conductive film 58.

Figure 7A:
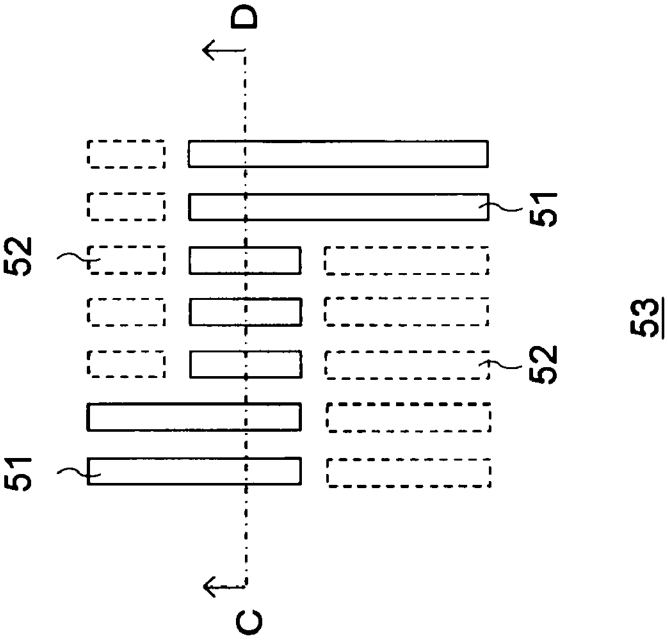
FIG. 7A is a plan view illustrating a semiconductor device producing step in which so-called a sidewall fabricating process is used.
Figure 7C:
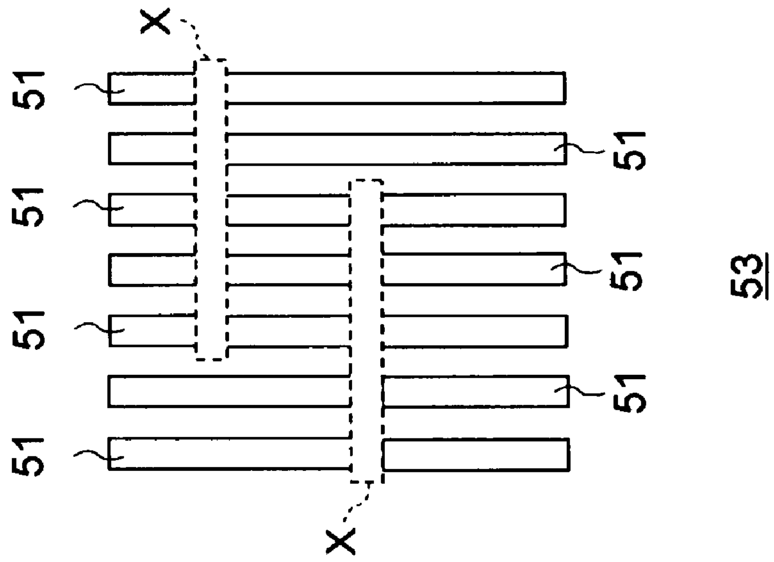
FIG. 7C is a plan view for explaining a method of forming a pattern of FIG. 7A.

(3) The resist film is formed on the fifth mask material 53, and the resist pattern including resists 51 and 52 is formed by the lithography. The width (line) and space of the resist pattern are double the minimum design rule, that is, 2 F. At this point, because the resist pattern runs in the same direction (longitudinal direction in FIG. 7A) in both the memory cell region and the peripheral region, the reducing exposure margin is avoidable in the peripheral region even if the exposure condition is optimized for the memory cell region. FIG. 7A is a plan view of the resist pattern. In FIG. 7A, the resist 51 (outline is expressed by a solid line) constitutes the finally-used interconnection, and the resist 52 (outline is expressed by a broken line) finally constitutes the dummy interconnection. The periodicity of the resist pattern is enhanced by providing the portion finally constituting the dummy interconnection, so that the reducing exposure margin is easily avoidable in the peripheral region. The resist pattern of FIG. 7A may be formed by the following method instead of the method of forming the resist pattern with the mask having the same pattern as the resist pattern shown in FIG. 7A. As illustrated in FIG. 7C, the resists 51, 51, . . . are formed only in the longitudinal direction, and the resist 52 constituting the dummy interconnection may be formed by removing the pattern located in openings X.

The resist 52 may be omitted.

(4) The fifth mask material 53 is etched with the resists 51 and 52 as the mask, and the resists 51 and 52 are removed by ashing. At this point, in addition to the ashing, the resists may be removed by performing a process with a mixed solution of sulfuric acid and hydrogen peroxide solution.

Figure 8A:
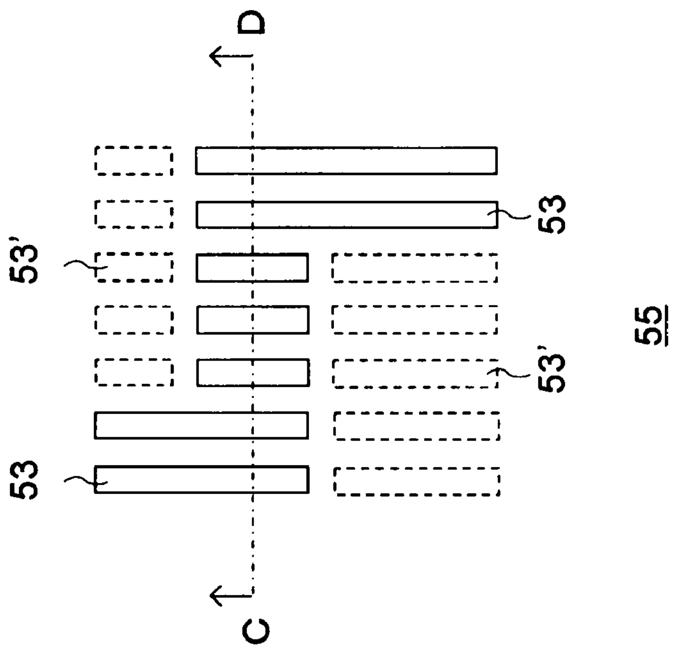
FIG. 8A is a plan view subsequent to FIG. 7A illustrating the semiconductor device producing step in which the sidewall fabricating process is used.
Figure 8B:
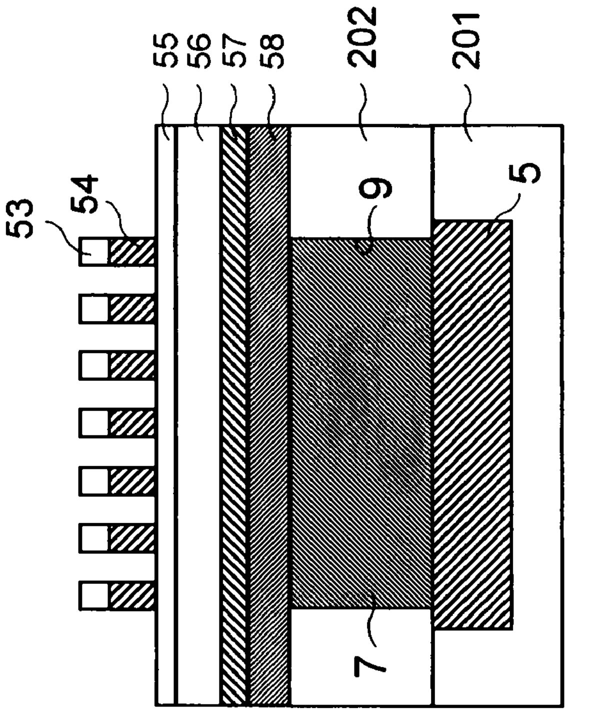
FIG. 8B is an end view taken along the line C-D of FIG. 8A.

(5) The fourth mask material 54 is etched with the polysilicon film 53 as the mask. FIGS. 8A and 8B are a plan view and an end view after the fourth mask material 54 is etched. In FIG. 8A, fifth mask materials corresponding to the positions of the resists 51 and 52 are expressed while distinguished from the fifth mask materials 53 and 53', respectively. Before the etching, because the pattern of the fourth mask material 54 directly takes over the resists 51 and 52, the width (line) and space are 2 F, that is, a pitch is 4 F.

(6) The pattern of the fourth mask material 54 is thinned by wet etching using ammonium fluoride aqueous solution or the like. At this point, the process condition is set such that the pattern of the fourth mask material 54 has the width (line) of F while having the space of 3 F.

Figure 9B:
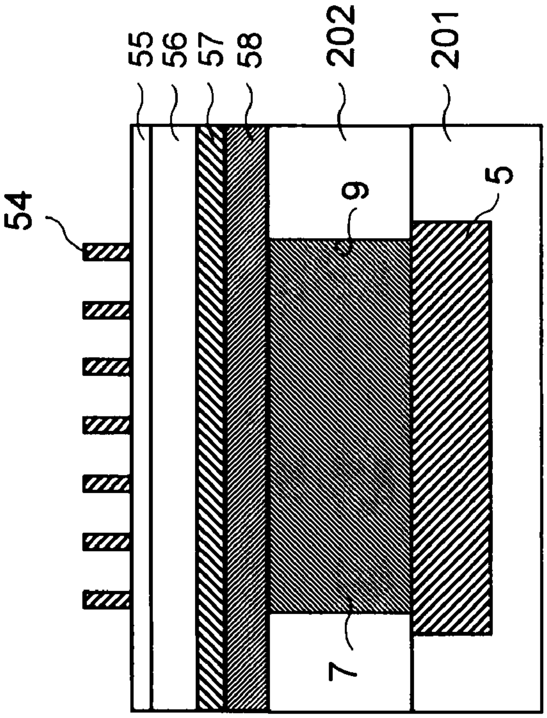
FIG. 9B is an end view taken along the line C-D of FIG. 9A.
Figure 9A:
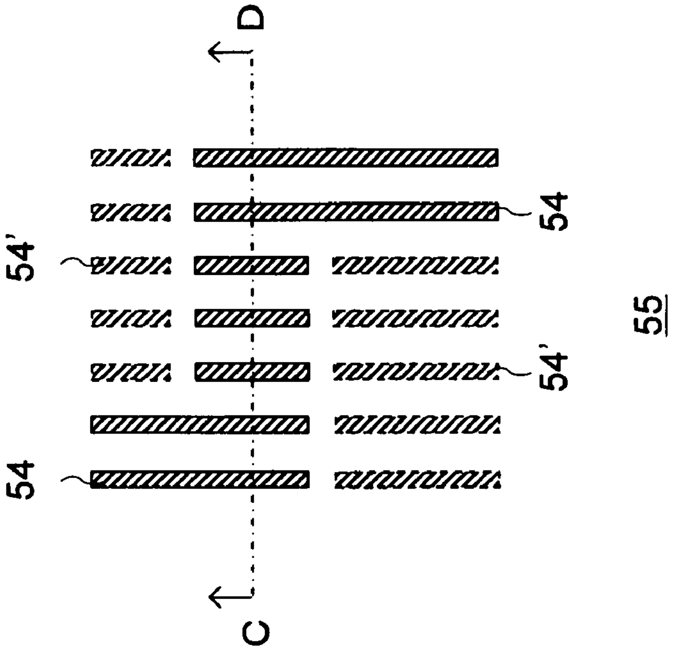
FIG. 9A is a plan view subsequent to FIG. 8A illustrating the semiconductor device producing step in which the sidewall fabricating process is used.

(7) The fifth mask material 53 is removed by wet etching or RIE. FIGS. 9A and 9B are a plan view and an end view after the fifth mask material 53 is removed.

Figure 10A:
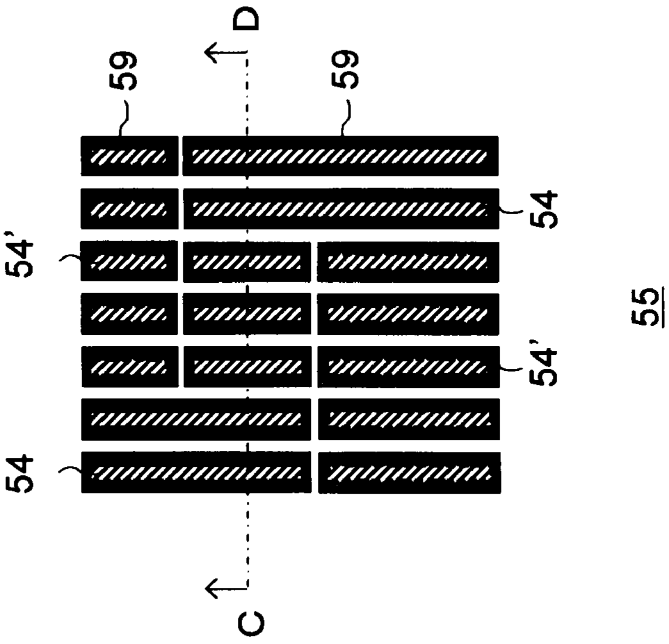
FIG. 10A is a plan view subsequent to FIG. 9A illustrating the semiconductor device producing step in which the sidewall fabricating process is used.
Figure 10B:
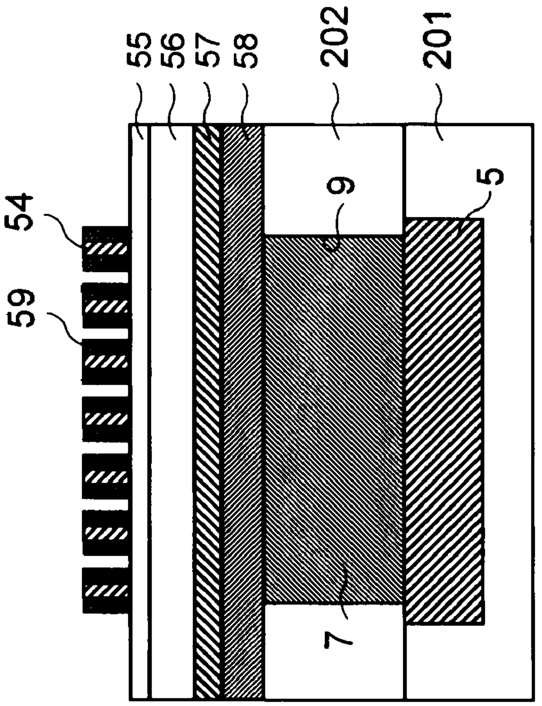
FIG. 10B is an end view taken along the line C-D of FIG. 10A.

(8) A sixth mask material made of polysilicon is deposited on the third mask material 55 and the fourth mask material 54, and the sixth mask material is etched by anisotropic etching such that the sixth mask material is left in a side portion of the fourth mask material 54. Therefore, a first circular mask material 59 is formed on the sidewall surface of the fourth mask material 54 so as to surround the fourth mask material 54. A thickness of the deposited sixth mask material and an etch back condition are set such that the first circular mask material 59 has the width (thickness) of F. FIGS. 10A and 10B are a plan view and an end view after the etch back.

Figure 11B:
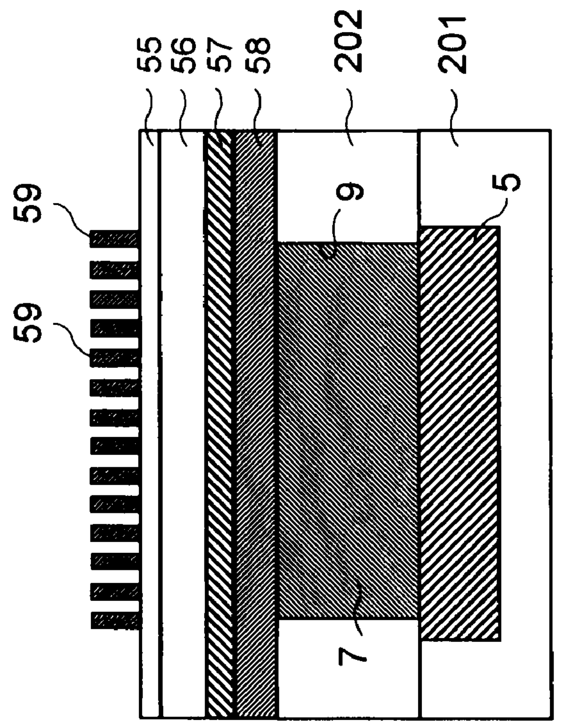
FIG. 11B is an end view taken along the line C-D of FIG. 11A.
Figure 11A:
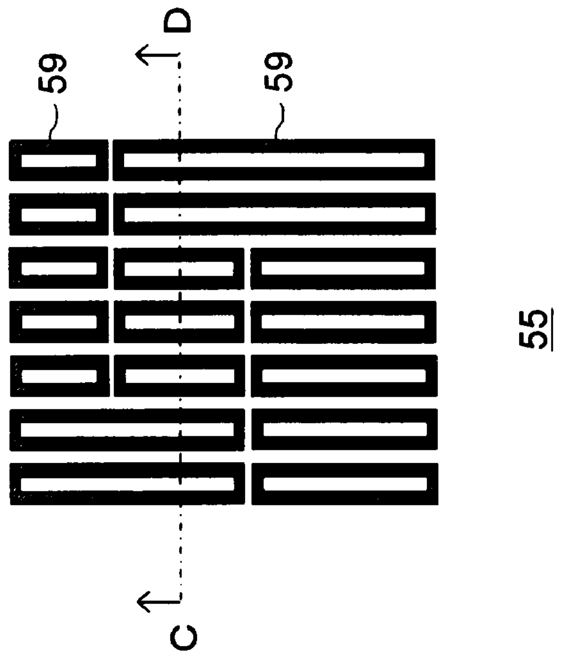
FIG. 11A is a plan view subsequent to FIG. 10A illustrating the semiconductor device producing step in which the sidewall fabricating process is used.

(9) The fourth mask material 54 is removed using the ammonium fluoride aqueous solution. FIGS. 11A and 11B are a plan view and an end view after the fourth mask material 54 is removed. The width (line) and space of the pattern made of the first circular mask material 59 become not 2 F but F at this stage. In removing the fourth mask material 54, because the third mask material 55 exists below the fourth mask material 54, the ammonium fluoride aqueous solution does not penetrate the third mask material 55, therefore the ammonium fluoride aqueous solution does not influence the layer below the third mask material 55.

Figure 12A:
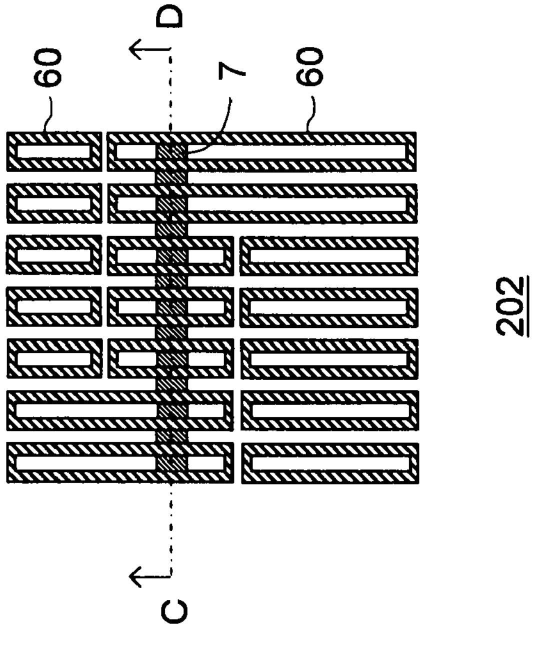
FIG. 12A is a plan view subsequent to FIG. 11A illustrating the semiconductor device producing step in which the sidewall fabricating process is used.
Figure 12B:
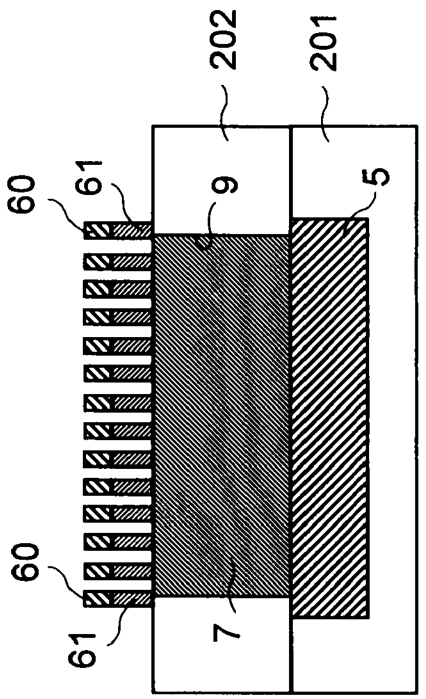
FIG. 12B is an end view taken along the line C-D of FIG. 12A.

(10) The layers below the third mask material 55 are etched in order with the first circular mask material 59 as the mask. Finally, the conductive film 58 is fabricated with the second mask material 56 as a sacrificial film, thereby forming the circular conductive film 61. Then the second mask material 56 is removed. FIGS. 12A and 12B are a plan view and an end view after the second mask material 56 is removed. As illustrated in FIGS. 12A and 12B, the width (line) and space of the pattern made of the circular conductive film 61 are F. As illustrated in FIG. 12B, the circular conductive films 61 and 61 located on right and left ends are electrically connected by the connection member 7 in the interlayer insulating film 202. That is, as with the first and second embodiments, the connection member 7 acts as the conventional interconnection bending.

(11) After the resist film is formed on the interlayer insulating film 202, the connection member 7, and a second circular mask material 60 made of the circularly-fabricated first mask material 57, a portion corresponding to an end portion of the circular conductive film 61 in the resist film is opened by the lithography. The portion in which the resist is opened is indicated by a portion A in FIG. 13.

(12) In the opened portions A, the second circular mask material 60 and the circular conductive film 61 are etched and removed by RIE to cut the end portion of the circular conductive film 61. Then the resist film is removed.

Figure 14:
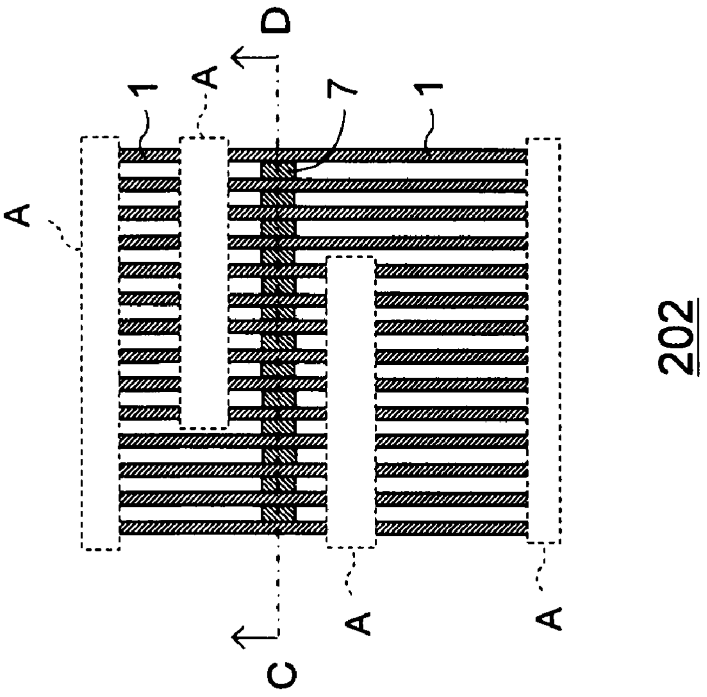
FIG. 14 is a plan view illustrating a semiconductor device after an interconnection in the portion A is removed.
Figure 13:
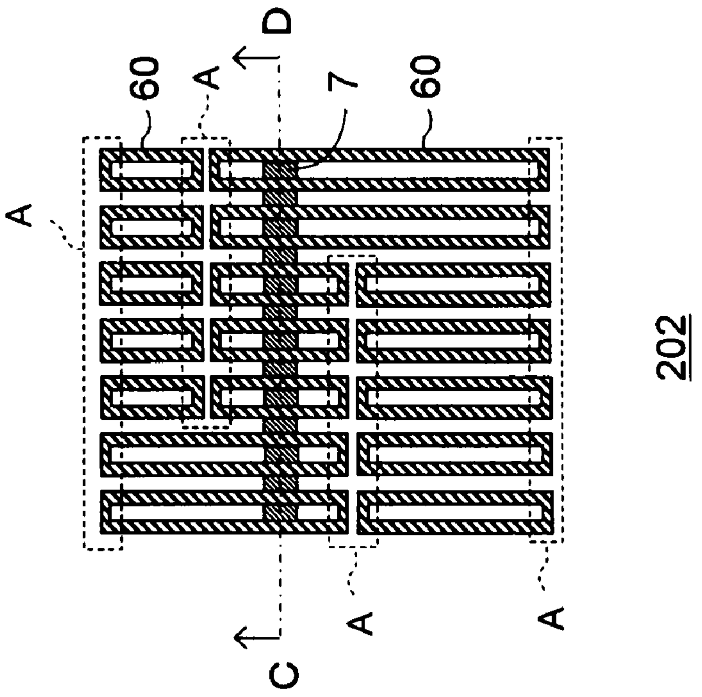
FIG. 13 illustrates a portion (portion A) in which a resist film is opened.

(13) Finally, the second circular mask material 60 is removed to complete the interconnections 1, 1, . . . as illustrated in FIG. 14. The width of the interconnection 1 is F, and the space between the interconnections is F. Although not illustrated, the interconnections 2, 2, . . . in which both the width of the interconnection 1 and the space between the interconnections are F is completed in the memory cell region.

In the semiconductor device producing method of the third embodiment, the semiconductor device includes the connection member 7 that crosses the spaces among the plurality of interconnections. Alternatively, the plurality of connection members 3 that cross the space between the interconnections may be formed in the interlayer insulating film 202 to produce the semiconductor device of the first embodiment. After the interconnection is formed by the sidewall fabricating process, the connection member may be formed in the interlayer insulating film formed on the interconnection, thereby forming the semiconductor devices of the modifications (see FIGS. 4, 5A, and 5B) of the first embodiment.

The third embodiment is not limited to the sidewall fabricating process. For example, in the semiconductor device producing method of the third embodiment, sometimes the second mask material 56 and the first mask material 57 are omitted. Additionally, the sidewall fabricating process that is used by those skilled in the art can be used.

As described above, in the third embodiment, the reducing exposure margin can be prevented in the peripheral region even if the exposure condition is optimized for the memory cell region, and the semiconductor device including the interconnection complying with the design rule smaller than the minimum resolution of the lithography can be produced.

In the first to third embodiments, the semiconductor storage device including the memory cell region and the peripheral region except for the memory cell region is used as the semiconductor device. However, the present invention is not limited to the semiconductor storage device. Generally, the present invention can be applied to the semiconductor device including a region having a plurality of interconnections running along a specific direction and another region where interconnections are required in a direction different from the specific direction in the same plane.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A semiconductor device comprising:
- a semiconductor substrate having a memory cell region and a peripheral region, the peripheral region being formed in a same plane as the memory cell region and in a different place from the memory cell region;
- an interlayer insulating film that is formed on the semiconductor substrate;
- a plurality of first interconnections that are formed above the memory cell region on the interlayer insulating film while complying with a first design rule, the plurality of first interconnections running along a specific direction;
- a plurality of second interconnections that are formed above the peripheral region on the interlayer insulating film while complying with a second design rule identical to the first design rule, the plurality of second interconnections running along the specific direction; and
- a connection member that is formed above the peripheral region in the interlayer insulating film, the connection member forming an interconnection pattern extending in a direction other than the specific direction and electrically connecting at least two second interconnections.

2. The semiconductor device according to claim 1, wherein the connection member is a conductive material that is embedded in a contact hole piercing the interlayer insulating film.

3. The semiconductor device according to claim 2, further comprising an insulating region that is formed in the semiconductor substrate,
- wherein the connection member contacts on the insulating region.

4. The semiconductor device according to claim 3, wherein the insulating region is an element separation region that electrically separates elements formed on the semiconductor substrate.

5. The semiconductor device according to claim 1, wherein the plurality of the first interconnections and the plurality of the second interconnections are formed in an identical layer.

6. The semiconductor device according to claim 1, further comprising a dummy interconnection that is formed between the plurality of second interconnections while complying with the second design rule, the dummy interconnection running along the specific direction.

7. The semiconductor device according to claim 1, wherein the connection member is provided so as to be linearly extended in a direction intersecting the specific direction, and the connection member intersects the plurality of second interconnections.

8. The semiconductor device according to claim 1, further comprising:
- a plurality of memory cells that constitute a memory cell array provided in the memory cell region; and
- a driving element that drives the memory cell provided in the peripheral region,
- wherein the plurality of first interconnections are bit lines, and
- the interconnection pattern connects the memory cell and the driving element.

9. The semiconductor device according to claim 1, wherein the first design rule is a minimum design rule.

10. A semiconductor device comprising:
- a semiconductor substrate having a first memory cell region and a peripheral region, the peripheral region being formed in a same plane as the memory cell region and in a different place from the memory cell region;
- a first interlayer insulating film that is formed on the semiconductor substrate;
- a plurality of first interconnections that are formed above the memory cell region on the first interlayer insulating film while complying with a first design rule, the plurality of first interconnections running along a specific direction;
- a plurality of second interconnections that are formed above the peripheral region on the first interlayer insulating film while complying with a second design rule identical to the first design rule, the plurality of second interconnections running along the specific direction;
- a second interlayer insulating film that is formed on the first interlayer insulating film; and a connection member that is formed above the peripheral region in the second interlayer insulating film, the connection member forming an interconnection pattern extending in a direction other than the specific direction and electrically connecting at least two second interconnections.

11. The semiconductor device according to claim 10, further comprising a dummy interconnection that is formed between the plurality of second interconnections while complying with the second design rule, the dummy interconnection running along the specific direction.

12. The semiconductor device according to claim 10, wherein the connection member is provided so as to be linearly extended in a direction intersecting the specific direction, and the connection member intersects the plurality of second interconnections.

13. The semiconductor device according to claim 10, wherein the first interconnections and the second interconnections are formed in an identical layer.

14. The semiconductor device according to claim 10, further comprising:

a plurality of memory cells that constitute a memory cell array provided in the memory cell region; and a driving element that drives the memory cell provided in the peripheral region, wherein the plurality of first interconnections are bit lines, and the interconnection pattern connects the memory cell and the driving element.

15. The semiconductor device according to claim 10, wherein the first design rule is a minimum design rule.

16. The semiconductor device according to claim 10, further comprising an upper-layer interconnection that is formed on the second interlayer insulating film.

17. The semiconductor device according to claim 16, further comprising the plurality of connection members, wherein the upper-layer interconnection is electrically connected to at least one of the plurality of connection members.

* * * * *